United States Patent [19]

Ishida

[11] 4,278,944
[45] Jul. 14, 1981

[54] CHOPPER TYPE SWITCHING CIRCUIT

[75] Inventor: Kohji Ishida, Tokyo, Japan

[73] Assignee: Pioneer Electronic Corporation, Tokyo, Japan

[21] Appl. No.: 54,118

[22] Filed: Jul. 2, 1979

[30] Foreign Application Priority Data

Jun. 30, 1978 [JP] Japan .................................. 53-80011

[51] Int. Cl.³ .............................................. H03D 1/18
[52] U.S. Cl. .................................... 329/103; 329/101; 307/240
[58] Field of Search ............ 179/1 GE; 307/244, 240, 307/254; 329/101, 103, 104

[56] References Cited

U.S. PATENT DOCUMENTS

| | | | |
|---|---|---|---|
| 2,985,772 | 5/1961 | Pittman, Jr. et al. ................. | 307/254 |
| 3,379,986 | 4/1968 | Leslie ..................................... | 307/244 |

Primary Examiner—David K. Moore
Attorney, Agent, or Firm—Sughrue, Rothwell, Mion, Zinn and Macpeak

[57] ABSTRACT

A chopper type switching circuit having first and second transmission paths adapted to transmit a predetermined input signal to respective output terminals. First and second switching elements are connected respectively between the mid points of the first transmission path and a reference voltage line. A group of resistors are series connected between the output terminals. Third and fourth switching elements are connected respectively between the series connection points of the group of resistors and the reference voltage line. The first and fourth switching elements and the second and third switching elements are controlled to be alternately rendered conductive and non-conductive.

8 Claims, 4 Drawing Figures

CHOPPER TYPE SWITCHING CIRCUIT

BACKGROUND OF THE INVENTION

This invention relates to chopper type switching circuits, and more particularly a chopper type switching circuit especially suited as the switching circuit of an FM MPX stereophonic signal demodulation circuit.

For a phase comparator or a synchronous detector in a PLL (phase locked loop) type MPX (multiplex) stereophonic signal demodulation circuit, a so-called "chopper type switching circuit" is conventionally employed. This circuit employs a pair of transistor devices alternatively turned on and off by using a signal synchronous with a subcarrier signal or a pilot signal and a signal opposite in phase to the aforementioned signal.

A switching circuit of this type, as shown in FIG. 1, comprises: a first series circuit of resistors R1 and R2; a second series circuit of resistors R3 and R4; a switching element, or a transistor Q1, having a control terminal (base) and having its input and output terminals connected between the series connection point of the resistors R1 and R2 and a reference voltage (Vc) line. A switching element, or a transistor, Q2 is similarly connected between the series connection point of the resistors R3 and R4 and the reference voltage (Vc) line. An input signal IN to be chopped is applied to the common input terminal of the first and second series circuits, and the chopped output is applied to output terminals OUT1 and OUT2 by alternately rendering the transistors Q1 and Q2 conductive and non-conductive. Accordingly, a signal in phase with a control signal applied to the base of the transistors and a signal opposite in phase to the aforementioned signal are separately provided at the output terminals OUT1 and OUT2. In FIG. 1, reference characters R8 and R9 designate the base input resistances, and RL1 and RL2, the loads.

If in the circuit thus organized the transistor Q1 is conductive while the transistor Q2 is nonconductive under the condition no input signal is available, then the voltage V1 at the output terminal OUT1 is:

$$V1 = \frac{RL1}{R2 + RL1} Vc$$

When the transistor Q1 is nonconductive while the transistor Q2 is conductive, the voltage V1' at the output terminal OUT1 is:

$$V1' = \frac{RL1}{R1 + R2 + R3 + RL1} Vc$$

Accordingly, the leakage component of a switching signal has the following difference between these voltages, that is, the peak value is provided at the output terminal OUT1. Since the higher input impedance is preferable in the chopper circuit, the resistors R1 and R3 are high in resistance. Therefore, the leakage of the switching signal is significant.

This phenomenon also occurs with the output terminal OUT2.

SUMMARY OF THE INVENTION

Accordingly, an object of the invention is to provide a chopper type switching circuit in which the leakage of the switching control signal to the output terminals is prevented.

It is another object of this invention to provide a chopper type switching circuit whereby the distortion factor and the S/N ratio are improved.

These and other objects of this invention are accomplished in a chopper type switching circuit having first and second transmission paths adapted to transmit a predetermined input signal to respective output terminals. First and second switching elements are connected respectively between the mid points of the first transmission path and a reference voltage line. A group of resistors are series connected between the output terminals. Third and fourth switching elements are connected respectively between the series connection points of the group of resistors and the reference voltage line. The first and fourth switching elements and said second and third switching elements are controlled to be alternately rendered conductive and nonconductive.

The first transmission path is made up of a series circuit of first and second resistors, and the second transmission path is made up of a series circuit of third and fourth resistors. The first switching element is connected between the series connection point of the first and second resistors and the reference voltage line. The second switching element is connected between the series connection point of the third and fourth resistors and the reference voltage line. The group of resistors is a series circuit of fifth, sixth and seventh resistors. The third switching element is connected between the series connection point of the fifth and sixth resistors and the reference voltage line. The fourth switching element is connected between the series connection point of the sixth and seventh resistors and the reference voltage line.

One example of a chopper type switching circuit according to this invention will be described with reference to the drawings and particularly to FIG. 2 in which those components which have been previously described with reference to FIG. 1 have therefore been designated by like reference characters.

BRIEF DESCRIPTION OF THE INVENTION

DESCRIPTION OF THE PREFERRED EMBODIMENT

Figure 1:
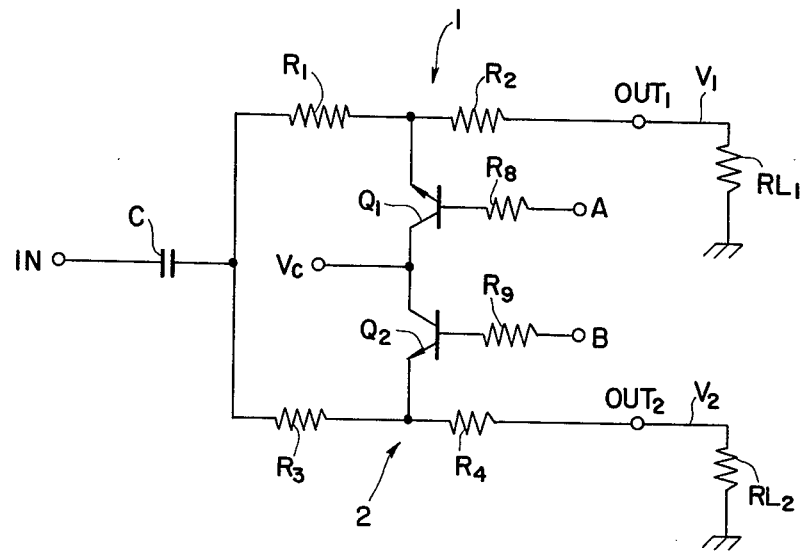
FIG. 1 shows a conventional chopper type switching circuit.
Figure 2:
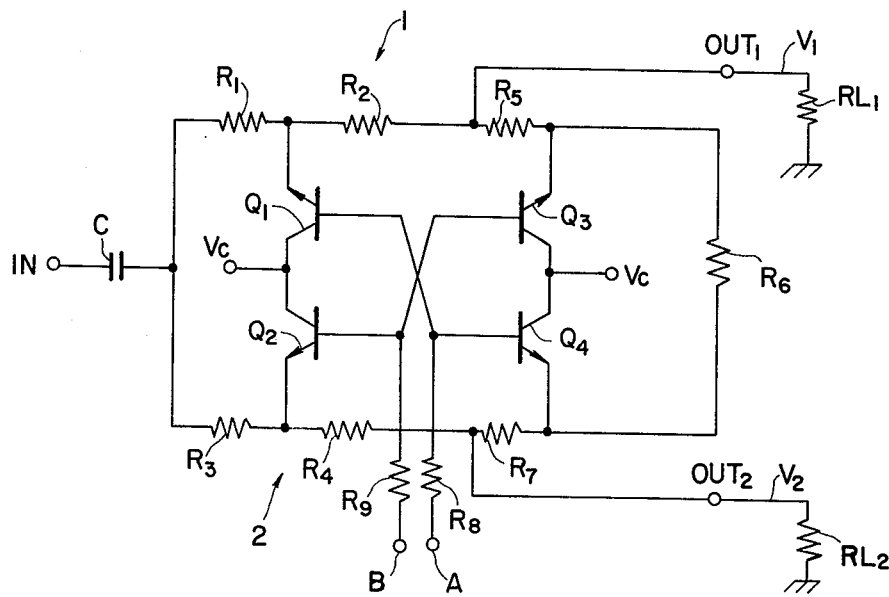
FIG. 2 illustrates one example of a chopper type switching circuit according to this invention.

In FIG. 2, only the components different from those in FIG. 1 will be described. A series circuit of resistors R5, R6 and R7 are connected between the output terminals OUT1 and OUT2 of first and second signal transmission paths which are first and second resistor series connection circuits 1 and 2, respectively. A switching transistor Q3 has its control terminal (base) coupled to the base of transistor Q2 and has its input-output path connected between the connection of the resistors R5 and R6 and a reference voltage (Vc) line, and a switching transistor Q4 is similarly connected between the connection of the resistors R6 and R7 and the reference voltage (Vc) line. The on-off operation of the transistor Q3 is controlled by the control signal B used for the on-off operation of the transistor Q2. Similarly, the on-off operation of the transistor Q4 is controlled by the control signal A used for the on-off operation of the transistor Q1.

The remaining components in FIG. 2 are similar to those in FIG. 1 and therefore the further description thereof will be omitted.

In the circuitry as shown in FIG. 2, when the transistors Q1 and Q4 are conductive (on) while the transistors Q2 and Q3 are non-conductive (off) under the condition that no input signal IN is available, the voltage V1 at the output terminal OUT1 is:

$$V1 = \frac{RL1}{(R5 + R6) \| R2 + RRL1} Vc \quad (1)$$

where, $(R5+R6)//R2$ is the parallel combined resistance of $(R5+R6)$ and R2, and the switching transistor carries out saturation operation and its saturation voltage $V_{CESAT}$ is substantially zero volts.

On the other hand, when the transistors Q1 and Q4 are non-conductive, while the transistors Q2 and Q3 are conductive, the voltage V1' at the output terminal OUT1 is:

$$V1' = \frac{RL1}{(R1 + R2 + R3) \| Rr + RL1} Vc \quad (2)$$

If, in the equation (1) and (2) $R1=R3=\frac{1}{2}R6$, and $R2=R4=R5=R7$, then the voltage expressed by the equations (1) and (2) are in balance with each other, i.e. $V1=V1'$. As a result, no switching signal leaks to the output terminal OUT1.

This principle can also be applied to the output terminal OUT2. Accordingly, no switching control signal leaks to both the output terminal. Furthermore, because the signal transmission circuits are made up of passive elements, namely the resistors, no distortion occurs and the S/N ratio is improved.

Figure 3:
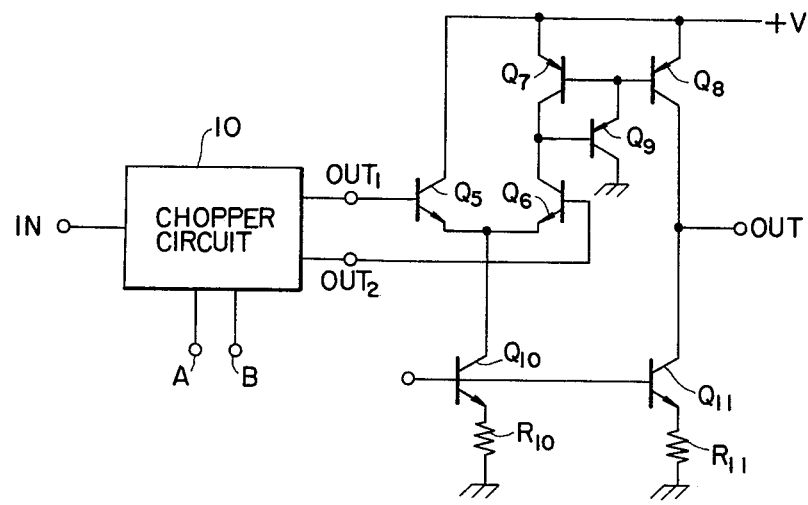
FIG. 3 is a circuit diagram showing one example of the case where the switching circuit shown in FIG. 2 is employed for a PLL synchronous detection circuit.

FIG. 3 shows one example of the case where the chopper type switching circuit 10 is illustrated in FIG. 2 is employed for the synchronous detection circuit of a PLL demodulation circuit. The outputs OUT1 and OUT2 of the switching circuit 10 are applied to the bases of a pair of differential transistors Q5 and Q6. A synchronous detection output OUT is obtained from a current mirror circuit comprising transistors Q7, Q8 and Q9, which is the active load of the transistor Q6. In the circuit of FIG. 3, transistors Q10 and Q11 and resistors R10 and R11 form a current source. The control signals A and B of the switching circuit 10 are the pilot signal (typically 19 KHz) of the stereophonic signal, and a signal opposite in phase to the pilot signal.

In the circuit of FIG. 3, no switching signal, 19 KHz, leaks to the outputs OUT1 and OUT2. Therefore, the capacitor which has been connected between the output terminals in the prior art can be eliminated, and accordingly the performance of the synchronous detection circuit is improved.

Figure 4:
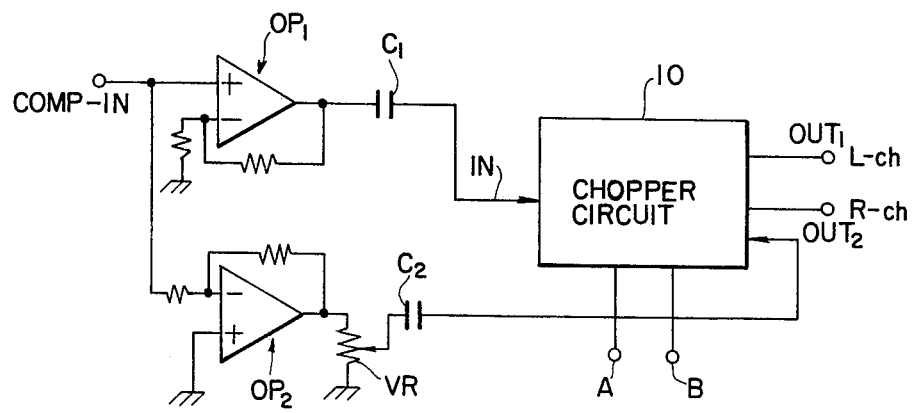
FIG. 4 is a circuit diagram showing one example of the case where the switching circuit shown in FIG. 2 is employed for an MPX demodulation circuit.

FIG. 4 shows one example of the case where the switching circuit 10 of the invention illustrated in FIG. 2 is employed for an FM MPX stereophonic signal demodulation circuit. A stereophonic composite signal COMP-IN subjected to FM detection is further subjected to positive phase amplification in an operational amplifier OP1. It is then applied through a capacitor C1 to the input terminal IN of the switching circuit 10.

On the other hand, the composite signal COMP-IN is subjected to inversion and amplification by an operational amplifier OP1. Then, after being subjected to amplitude control for separation adjustment by variable resistor VR, the signal thus treated is applied to another input terminal of the switching circuit 10 through a capacitor C2. The other input terminal is the mid point of the resistor R6 shown in FIG. 2. The control signals A and B of the switching circuit 10 are a signal in phase with the subcarrier signal (typically 38 KHz) and a signal opposite in phase to the latter.

Accordingly, the separated right and left channel signals are produced as outputs to the output terminals OUT1 and OUT2, respectively. In this case, an excellent MPX demodulation circuit free from the leakage of the signal 38 KHz is obtained.

This invention is not limited to the exact mode set forth in FIG. 2. If in FIG. 2, instead of the switching control signals A and B, a muting control signal is applied to render all of the transistors conductive, then the signal IN is not transmitted to the output terminal OUT1 or OUT2. Therefore, the circuit may be operated as a muting circuit. The muting circuit thus formed is advantageous in that no pop sound is produced because no DC level variation is caused at the output terminal during the muting operation. It is apparent that other modifications may be made within the scope of this invention.

What is claimed is:

1. A chopper type switching circuit comprising; first and second transmission paths adapted to transmit a predetermined input signal to respective output terminals from a first input terminal; first and second switching elements each having an input terminal, an output terminal and a control terminal and having their input and output terminals connected respectively between the mid points of said first and second transmission paths and a reference voltage line; a group of resistors series connected between said output terminals; and third and fourth switching elements connected respectively between the series connection points of said group of resistors and said reference voltage line, said first and fourth switching elements and said second and third switching elements being controlled to be alternately rendered conductive and nonconductive.

2. A chopper type switching circuit as in claim 1, wherein said first transmission path is made up of a series circuit of first and second resistors, said second transmission path is made up of a series circuit of third and fourth resistors, said first switching element connected between the series connection point of said first and second resistors and said reference voltage line, said second switching element connected between the series connection point of said third and fourth resistors and said reference voltage line, said group of resistors comprises a series circuit of fifth, sixth and seventh resistors, said third switching element connected between the series connection point of said fifth and sixth resistors and said reference voltage line, and said fourth switching element connected between the series connection point of said sixth and seventh resistors and said reference voltage line.

3. A chopper type switching circuit as in claim 2, in which the resistance of each of said first and third resistors is equal to the half of the resistance of said sixth resistor, and said second, fourth, fifth and seventh resistors are equal to one another in resistance.

4. A chopper type switching circuit as in claims 1, 2 or 3 further comprising a pair of differential transistors having their bases coupled to said output terminals a current circuit coupled to the collectors of said differential transistors and a current source coupled to the emitters of said pair of differential transistors, whereby a synchronous detection circuit is formed with an output from said current circuit.

5. The chopper type switching circuit as in claim 4 wherein said current circuit is a current mirror circuit comprising first and second transistors having their bases and emitters coupled and a third transistor having its emitter coupled to the bases of said first and second transistors, said coupled emitters connected to the collector of one of said differential transistors and the base of said third transistor coupled to the collector of said other transistor in said pair of differential transistors.

6. A chopper type switching circuit as in claims 1, 2 or 3 further comprising a second input terminal at the midpoint of said group of resistors, a first operational amplifier receiving a composite input signal and providing said predetermined input signal, a second operational amplifier receiving said composite input signal and subjecting it to inversion and amplification, said inverted and amplified signal applied to said second input terminal whereby a multiplex demodulation circuit is formed.

7. A chopper type switching circuit as in claim 6 further comprising a variable resistor for separation adjustment of said inverted and amplified signal interposed between said second operational amplifier and said second input.

8. A chopper type switching circuit comprising; first and second transmission paths adapted to transmit a predetermined input signal to respective output terminals from a first input terminal; first and second switching elements connected respectively between the mid points of said first and second transmission paths and a reference voltage line; a group of resistors series connected between said output terminals; and third and fourth switching elements connected respectively between the series connection points of said group of resistors and said reference voltage line, said first, second, third and fourth switching elements being controlled to be rendered conductive, whereby said input signal is not transmitted to said output terminals, and hence said switching circuit operates as a muting circuit.

* * * * *